Sept. 20, 1971 R. A. RINALDI ET AL 3,606,132

SOLDERING APPARATUS FOR PRINTED CIRCUIT BOARDS

Filed Feb. 25, 1970 2 Sheets-Sheet 1

INVENTORS
RALPH A. RINALDI
WILLIAM TIPPY
BY Ralph R. Roberts
AGENT

SOLDERING APPARATUS FOR PRINTED CIRCUIT BOARDS

Filed Feb. 25, 1970 2 Sheets-Sheet 2

INVENTORS
RALPH A. RINALDI
WILLIAM TIPPY
BY
Ralph R. Roberts
AGENT

United States Patent Office 3,606,132

Patented Sept. 20, 1971

3,606,132

SOLDERING APPARATUS FOR PRINTED CIRCUIT BOARDS

Ralph A. Rinaldi, Hawthorne, N.J., and William Tippy, Philadelphia, Pa., assignors to Henry Mann, Inc., Feasterville, Pa.

Filed Feb. 25, 1970, Ser. No. 13,888
Int. Cl. B23k *1/08*
U.S. Cl. 228—36 15 Claims

ABSTRACT OF THE DISCLOSURE

Apparatus for the dip soldering of printed circuit boards includes a platform or frame carried on a plurality of pivotally mounted links or arms having their lower ends carried by the base so as to be disposed in a parallelogram array. With the platform moved to an up condition, a printed circuit board is removably gripped in spring fingers adjustably carried by the platform. In this up condition the gripped printed circuit board is above and parallel to the surface of a body of molten solder in a heated container. To solder the circuit of the board, the platform and gripper board is swung on the links toward the molten solder until the under surface of the board just enters the molten solder to a shallow determined depth. The loading platform is carried on rods disposed to permit the transverse movement of the loading platform from a position above the molten solder trough or container to a position to the side of and above the solder trough. This manipulation is preferably accomplished by pulling the platform outwardly from above the solder trough. The swinging of the platform on the arms is preferably by a pneumatic cylinder which as it moves the platform towards the solder engages an adjustable stop disposed to limit the penetration of the printed circuit board into the molten solder to a determined depth. A dross skimmer as part of the cover is also provided on this apparatus so that the dross which accumulates on top of the solder may be readily skimmed therefrom to provide clean molten solder adapted for making the connections on the printed circuit board.

BACKGROUND OF THE INVENTION

Field of the invention

With reference to classifications of art established in the United States Patent Office, the art to which the present invention pertains is found generally in the class titled "Metal Working" and particularly in the subclass thereunder of "process of manufacture of plural bonded joints"; and in the class of "Metal Fusion-Bonding Apparatus" and particularly in the subclasses of "with means to juxtapose and bond plural workpieces," and of "with means to skim dross."

Description of the prior art

This invention pertains primarily to the dip soldering of printed circuit boards by means of apparatus, and this method of soldering of course has been and is performed by many elaborate machines adapted to automatically receive a printed circuit board and align this printed circuit board in transporting means as to the portion or portions to be soldered and then usually move the printed circuit board over and in way of a solder covered rotating roller whereat the solder is applied to the printed circuit board. These machines and similar apparatus usually cause the printed circuit board to be carried in way of a wave of solder transported on the surface of a rotating drum. The rotation of this drum is made sufficient to lift the solder from the trough and in way of the printed circuit board as it passes by the solder station. The use of automatic equipment for economical reasons requires that several hundred circuit of similar size and construction be processed through the apparatus for soldering the boards. The use of this automatic equipment is impractical from a fiscal standpoint when the printed circuit boards to be soldered are in groups of as few as fifty to a hundred boards. When this condition occurs it is desirable to perform the dip soldering by means of a hand or motor actuated mechanism wherein the printed circuit board is held in a grip means and then is advanced or lowered into a heated solder bath. Typical of such known apparatus is the dip soldering apparatus shown in U.S. Pat. No. 3,226,821 as issued to Van Dijk on Jan. 4, 1966, and the dip soldering machine shown in U.S. Pat. No. 2,875,717 as issued to McWilliams on Mar. 3, 1959. In these and other hand operated printed circuit board soldering apparatus, as far as is known, there is shown no platform on which readily adjustable spring clips or fingers are provided for the gripping of the board. Also as far as is known, there is no apparatus in which the circuit board supporting platform is also slidable transversely from a position above the solder trough or tank to a position adjacent to the solder trough so that the printed circuit board may be removably mounted in clips at a position other than over the solder bath.

SUMMARY OF THE INVENTION

The present invention may be summarized in part with reference to its objects.

It is an object of this invention to provide, and it does provide, soldering apparatus for the dip soldering of printed circuit boards in which adjustable gripping means are provided whereby one or more boards are gripped in a position parallel to a support platform. This platform is carried on a plurality of arms movable in a parallelogram array so that the platform and gripped board may be swung from an up position above a melted supply of solder whereat the underside of the board is brought into contact with the molten solder.

It is a further object of this invention to provide and it does provide, soldering apparatus for the dip soldering of printed circuit boards in which the platform, while being supported on pivoted arms and movable in a parallelogram pattern is also movable transversely from a position over the solder trough or container to a position adjacent the trough.

It is a further object of this invention to provide and it does provide, soldering apparatus for the dip soldering of printed circuit boards in which the soldering trough or pot is provided with a cover disposed to be slid over the molten solder to prevent accident or injury to the operator and the dropping of contaminating material into the solder, the cover is provided with a dross-skimming member adapted to be actuated by and during the reciprocating movement of the cover over the pot.

The soldering apparatus of this invention includes a base having a solder pot over which is reciprocably carried a cover having a dross-skimming member adapted to clean the dross from the solder with a reciprocation movement of the cover over the pot. A platform or frame is pivotally carried on three equal length arms pivotally attached to the base so that the platform is moved from a determined position above the solder pot toward the solder pot in a parallelogram manner. Spring grip fingers are adjustably carried on the platform so as to be selectively positioned for removably gripping a determined size and shaped circuit board. The platform is slidably carried on a pair of rods so that the platform may be moved from above the pot to a position adjacent the pot whereat the circuit board or boards may be removed or loaded for soldering.

A pneumatic cylinder has one end mounted on the base and the other end attached to the platform or arm so as to move the platform toward and from the solder pot. Adjustable limit means is provided for precisely establishing the extent of downward movement of the platform so as to bring a gripped circuit board just into the molten solder.

INTENT OF THE DISCLOSURE

Although the following disclosure offered for public dissemination is detailed to insure adequacy and aid in understanding of the invention, this is not intended to prejudice that purpose of a patent which is to cover each new inventive concept therein no matter how it may later be disguised by variations in form or additions of further improvements. The claims at the end hereof are intended as the chief aid toward this purpose, as it is these that meet the requirement of pointing out the parts, improvements or combinations or methods in which the inventive concepts are found.

There has been chosen a specific embodiment of the soldering apparatus for printed circuit boards as adopted for use in dip soldering small lots of like circuit boards. This specific embodiment has been chosen for the purposes of illustration and description as shown in the accompanying drawing wherein:

BRIEF DESCRIPTION OF THE DRAWINGS

In the following description and in the claims various details will be identified by specific names for convenience, these names, however, are intended to be generic in their application. Corresponding reference characters refer to like members throughout the several figures of the drawings.

Figure 1:
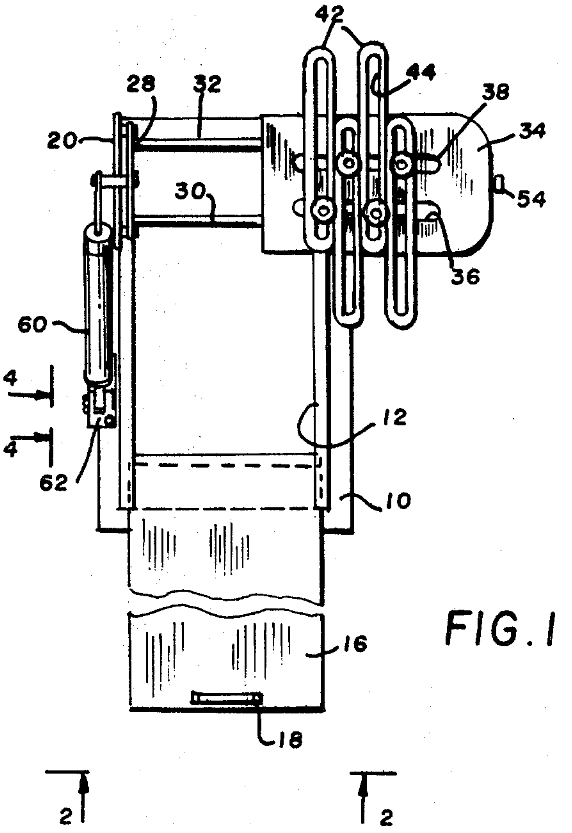
FIG. 1 represents a somewhat schematic plan view of the dip soldering apparatus of this invention and showing the general arrangement of the several components and with the platform which carries the gripped circuit board moved to a position adjacent the soldering trough or pot.

The drawings accompanying, and forming part of, this specification disclose certain details of construction for the purpose of explanation of the broader aspects of the invention, but it should be understood that structural details may be modified in various respects without departure from the concept and principles of the invention.

DESCRIPTION OF THE PREFERRED EMBODIMENT

Referring now in particular to the dip soldering apparatus of FIGS. 1 through 8 there is shown a preferred embodiment wherein a base 10 is provided with a heatable solder pot or reservoir 12 of conventional construction and, as shown, of rectangular configuration. The side walls of this pot have upwardly extending side walls and in the opposed longitudinal walls there are formed grooves 14 and 15 which grooves are sized and spaced to slidably receive and retain a cover 16. A handle 18 is attached to the upper surface of the cover and permits a ready grasping of the handle by the operator for the moving of the cover over the heated solder storage portion or to a position at one end of the heated solder pot.

As seen particularly in FIGS. 1, 2, 5 and 6 the base 10 or side of the pot portion has attached to it a support plate 20 on which are pivotally mounted three like arms 22, 24 and 26. These arms pivotally carry on their upper end a support header member 28 which is movable on and with these arms so as to provide a pantograph arrangement with the member 28 forming an upper leg of a parallelogram so as to always be in a plane parallel to base 10 and the top surface of the molten solder in the pot 12. Attached to the header member 28 and extending at right angles to the plane of arms 22, 24 and 26 are a pair of guide rods 30 and 32 upon which an upper platform 34 is movably supported by a pair of ball bushings disposed in parallel alignment. These bushings are spaced and sized in the platform so as to mate with the guide rods 30 and 32 permitting the platform to easily and precisely be reciprocally moved on the rods. Of course other bushings or guides may be used and rods 30 and 32 may be other than round so long as the purpose of providing a transverse guide means and sliding support for the platform is accomplished.

Figure 3:
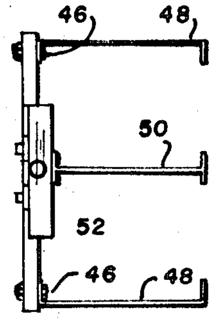
FIG. 3 represents an end view of the platform and spring clips disposed to releasably grip a pair of circuit boards, the view taken on the line 3—3 of FIG. 1.
Figure 2:
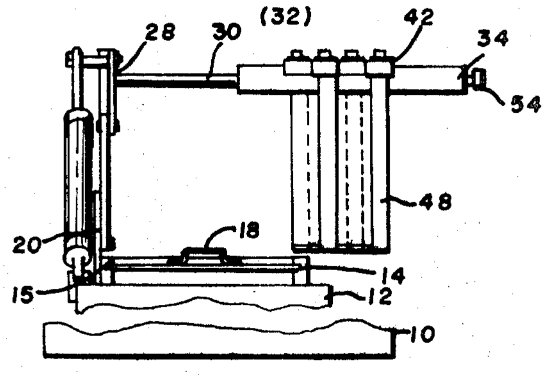
FIG. 2 represents an end view of the apparatus as taken on the line 2—2 of FIG. 1.
Figure 4:
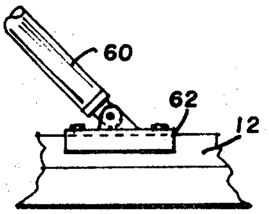
FIG. 4 represents a somewhat fragmentary view taken on the line 4—4 of FIG. 1 and showing the end of the pneumatic cylinder attached to the base by an adjustably mounted bracket.
Figure 5:
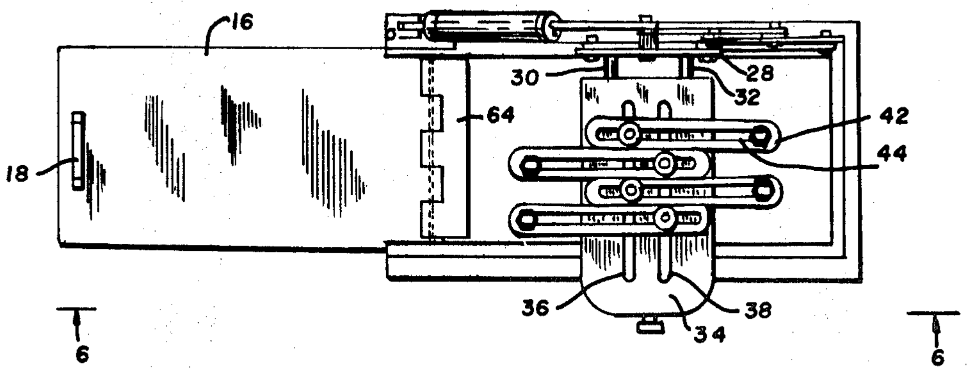
FIG. 5 represents a plan view of the dip soldering apparatus of FIG. 1 but with the platform carrying the gripped circuit board or boards positioned above the solder pot and with the undersurface of the board in engagement with the molten solder in the pot.

The platform 34 is provided with a pair of substantially parallel slots 36 and 38 which slots in the embodiment shown are also parallel to the axis of the bushings for rods 30 and 32. These slots 36 and 38 are sized so as to each slidably receive the body of a bolt 40 at the point where the body passes through the platform. Also shown in this preferred embodiment are four like support arms 42 which are adjustably clamped to the platform 34 by the bolts 40. These arms 42 each have a slot 44 formed lengthwise therein so that the arm may be adjustably positioned on a bolt 40 after which this bolt is tightened to retain the arm 42 in its selected position on the platform. Removably attached by bolts 46 to the underside of arms 42 are spring fingers 48 which have their lower ends formed with inturned shoulder portions to provide supporting lips for a printed circuit board as it is releasably gripped between opposed spring fingers. On occasion it may be desirable to provide intermediate spring fingers 50 which are attached by cap screws 52 to the underside of the platform 34. Such an arrangement as seen in FIG. 3 permits a plurality of circuit boards to be simultaneously gripped at a determined distance below the platform so that with one swinging movement of the platform toward the molten solder in the pot the circuit boards may be simultaneously dipped a determined shallow distance into the molten solder.

As shown in the present embodiment, the platform 48 has a knob 54 fastened to its outer or right end so that the platform may be moved as desired to and from header member 28 on guide rods 30 and 32 by the operator. The movement of the platform with the supported printed circuit boards toward and from the molten solder in the pot 12 is preferably accomplished by means of a pneumatic cylinder 60 which has its lower end pivotally attached to the base 10 as seen particularly in FIG. 4. The upper or rod end of the cylinder 60 is pivotally attached to the header member 28 so that by means of a valve control not shown the cylinder 60 is caused to rapidly move the platform and suspended circuit boards toward and to the solder pot and then from the pot to a suspended condition.

Adjustment as to the lower limit of travel of the platform, is desired in the prseent form of the apparatus and, as shown, bracket 62 which pivotally supports the lower end of cylinder 60 is shown as adjustably mounted on base 10. Moving the bracket toward or away from the support plate 20 causes the platform 34 to move further from or closer to the top of the molten solder.

Figure 6:
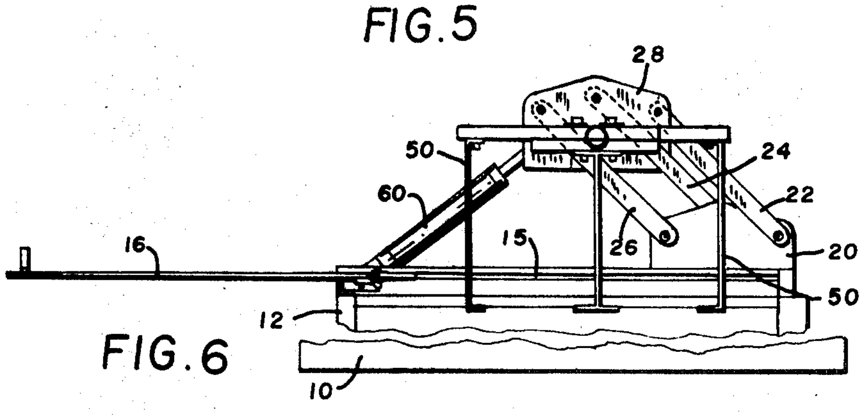
FIG. 6 represents a side view of the dip soldering apparatus in the condition of FIG. 5, the view being taken on the line 6—6 of FIG. 5.
Figure 7:
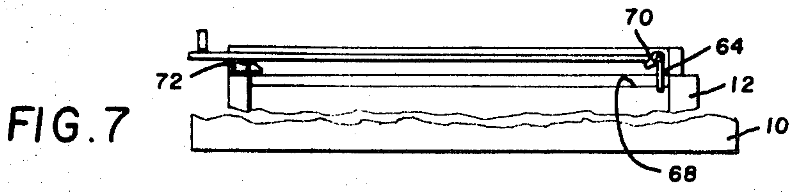
FIG. 7 represents a fragmentary side view of the solder pot showing in particular the cover moved to a forward pot-covering position with a dross-skimming member portion hanging downwardly into engagement with the top surface of the molten solder.
Figure 8:
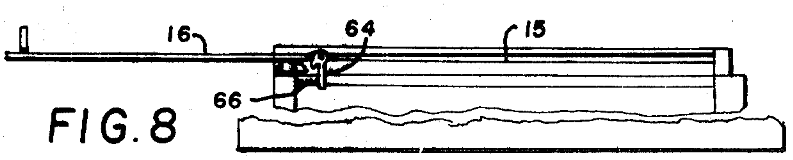
FIG. 8 represents the fragmentary view of the pot of FIG. 7 but with the cover moved rearwardly to skim the dross from the surface of the molten solder and to make the solder clean for soldering the printed circuit board.

Referring finally to FIGS. 6, 7 and 8 and to the pot 12 and cover 16 it is to be noted that the forward or right end of cover 16 includes a leaf portion 64 pivotally attached to provide a dross scraping means for removing accumulated dross 66 from the top of the molten solder which is identified as 68. Preferably leaf member 64 has a latch finger portion 70 disposed to engage a ramp cam 72 carried by and on the side of the pot 12 so that as the cover 16 is moved leftwardly to a position substantially as shown in FIG. 8 the dross is skimmed from the solder and is moved to the left end of the pot. When the latch finger 70 moves into engagement with the ramp cam 72 the end 64 is caused to be lifted to the position shown in FIG. 6. Detent means may be provided to hold end 64 in an up condition until the cover is moved to the extreme right as seen in FIG. 7 whereat the end 64 is caused to be disengaged from the detent and to hang down so that the lower portion of the leaf member 64 enters a little way into the molten solder as seen in FIGS. 7 and 8. Gravity is contemplated as maintaining the leaf member 64 in the downward condition while the cover is moved leftwardly from the position of FIG. 7 to the position of FIG. 8. During this movement the dross 66 is skimmed from the molten solder.

USE AND OPERATION

The dip soldering apparatus as shown and above described is preferably operated in the following manner. With the pneumatic cylinder 60 actuated to cause the platform 34 to be lifted to its highest position the platform form 34 is pulled on rods 30 and 32 to the extreme position away from header member 28. Support arms 42 are adjusted so that spring fingers 48 accept and releasably grip one or more printed circuit boards. If desired, intermediate finger 50 may be mounted in place on the platform and be used to support and grip one or more printed circuit boards. With the boards mounted in the spring fingers the platform 34 is moved over the solder pot to a position adjacent the header member 28. Cover member 16 may or may not be cycled as desired to remove dross from the molten solder surface, however it is essential that the cover be in the position of FIG. 6 so that the solder pot is uncovered when the cylinder 60 is actuated to move the platform 34 and the supported printed circuit boards to and lightly onto the top of the molten solder. A cycle dump valve in the pneumatic control for the cylinder is timed so that cylinder 60 is actuated to lift the platform to its up position after a very brief period of time such as two or three seconds at its lowest position. This selected duration period of time is only necessary to insure that the desired soldering operation is satisfactorily accomplished.

In the "up" position the platform is again pulled by the operator to the position of FIG. 1 whereat the soldered printed circuit boards are removed from the spring fingers and unsoldered boards are mounted in the fingers for a repeat of the above cycle. Soldering flux, when desired, may be applied to the board before mounting in the fingers, after mounting in the fingers as by a spray application, or the flux may be floated on the surface of the colten solder. The cycling occurence of the cover 16 is only made as required to remove dross from the top of the molten solder as it reaches an undesirable accumulation or when the cover is desired to cover the solder to prevent contamination or assist in the heating of the solder. The replenishing of solder to maintain a desired level of molten solder in the pot may be by the operator in response to the observation of the pot or by automatic means not shown. Automatic replenishing of the solder as it is used may be by one of many methods which are well known and are conventional and no significance is ascribed to the means for maintaining the solder level in the pot.

In the above specification and in the claims to follow the term "printed circuit boards" as applied to dip soldering is contemplated as including the "tinning" of the ends of the leads of components such as resistors, condensers and the like, the soldering of connections of two or more leads from one or more components and the many similar joining or preparing of components by the application of dipping of a member or portion thereof into molten solder. The use of the cover 16 for the pot as above described and shown is a preferred arrangement but it is recognized that this member may be omitted and that the dross may be skimmed from the pot by other means.

Terms such as "left," "right," "up," "down," "bottom," "top," "front," "back," "in," "out," and the like are applicable to the embodiment shown and described in conjunction with the drawings. These terms are merely for the purposes of description and do not necessarily apply to the position in which the soldering apparatus may be constructed or used.

The conception of the dip soldering apparatus and its many applications is not limited to the specific embodiment shown but departures therefrom may be made within the scope of the accompanying claims and protection is sought to the broadest extent the prior art allows.

What is claimed is:

1. Apparatus for the dip-soldering of workpieces such as printed circuit boards, tinning of leads of electrical components and the like in which the apparatus includes: (a) a base; (b) a solder pot carried by the base; (c) at least two arms supported by the base and having their lower ends pivotally mounted on shafts whose axes are parallel to each other; (d) a support header member pivotally carried on and at the other ends of the support arms and as carried by the arms arranged in a pantograph manner so as to be movable in a parallelogram manner towards and from an upper surface of solder in said solder pot; (e) a platform carried by said support header member; (f) clip retaining means movably mounted on said platform and disposed to extend below the platform to removably grip a workpiece for transport to and from the solder pot; (g) means for moving the platform toward the solder pot to bring the gripped workpiece to be soldered to a determined depth in a body of molten solder, and (h) means for limiting the upper and lower extent of travel of the platform and gripped workpiece towards and from the pot.

2. Apparatus for dip soldering as in claim 1 in which the platform is carried on a support guide transversely mounted on the support header, said guide of an extent sufficient to permit the platform to be moved from a position above the solder pot to a position adjacent the pot.

3. Apparatus for dip soldering as in claim 2 in which the support guide is a pair or rods attached to the support header, said rods cooperatively positioned and sized to be engaged by bushings provided in parallel bores formed in the platform.

4. Apparatus for dip soldering as in claim 2 in which the platform is provided with slots of determined extent and disposed substantially parallel to the support guide, said slots sized to receive the shank of a bolt by which the clip retaining means is movably mounted.

5. Apparatus for dip soldering as in claim 4 in which at least one slotted support arm is carried by the bolt in a slot in the platform, and in which at least one clip retaining means is removably attached to a support arm.

6. Apparatus for dip soldering as in claim 1 in which the clip retaining means includes at least one spring member having an inturned supporting lip.

7. Apparatus for dip soldering as in claim 1 in which the solder pot is provided with longitudinal guide means in which a dross-skimming means is reciprocably carried.

8. Apparatus for dip soldering as in claim 7 in which the dross-skimming means is a cover slidable in the longitudinal guide means, said cover having a hinged end disposed to hang downwardly with its lower end extending into the molten solder and in which there is provided means for moving the hinged end to a lifted position above the molten solder when the hinged end is moved to one end of the pot and for maintaining the hinged end in this lifted position as and until the cover is moved to the other end of the pot.

9. Apparatus for dip soldering as in claim 1 in which the means for moving the platform to and from the solder pot is a piston-type cylinder actuated by pressurized air, hydraulic fluid under pressure and the like.

10. Apparatus for the dip-soldering of workpieces such as printed circuit boards, the tinning of leads of electrical components and the like in which the apparatus includes: (a) a base; (b) a solder pot carried by the base; (c) at least two arms supported by the base and having their lower ends pivotally mounted on shafts whose axes are parallel to each other; (d) a support header member pivotally carried on and at the other ends of the support arms and as carried by the arms and arranged in a pantograph manner so as to be movable in a parallelogram manner towards and from an upper surface of solder in said solder pot; (e) a platform carried by said support header member said platform being slidably carried on a support guide transversely mounted on the support header and being movable thereon to limits of travel whereat at one position the platform is above the solder pot and at the other position the platform is adjacent the pot; (f) clip retaining means movably mounted on said platform and disposed to extend below the platform to removably grip a workpiece for transport to and from the solder pot; (g) means for moving the platform toward the solder pot to bring the gripped workpiece to be soldered to a determined depth in a body of molten solder, and (h) means for limiting the upper and lower extent of travel of the platform towards and from the pot.

11. Apparatus for the dip soldering of workpieces as in claim 10 in which there are three support arms and in which the platform is provided with slots of determined extent and disposed substantially parallel to the support guide, said slots sized to receive the shank of a bolt by which the clip retaining means is mounted.

12. Apparatus for the dip soldering of workpieces as in claim 11 in which the clip retaining means includes at least one spring member having an inturned supporting lip, and in which at least one slotted support arm is carried by the bolt in a slot in the platform and in which at least one clip retaining means is removably attached to a support arm.

13. Apparatus for dip soldering of workpieces as in claim 10 in which the means for moving the platform to and from the solder pot is a piston-type cylinder actuated by pressurized air, hydraulic fluid under pressure and like.

14. Apparatus for dip soldering of workpieces as in claim 13 in which the solder pot is provided with longitudinal guide means in which is carried a reciprocable dross-skimming means.

15. Apparatus for dip soldering of workpieces as in claim 14 in which the dross-skimming means is a cover slidable in the longitudinal guide means, said cover having a hinged end disposed to hang downwardly with its lower end extending into the molten solder and in which there is provided means for moving the hinged end to a lifted position above the molten solder when the hinged end is moved to one end of the pot and for maintaining the hinged end in this lifted position as and until the cover is moved to the other end of the pot.

References Cited

UNITED STATES PATENTS

| | | | |
|---|---|---|---|
| 3,056,371 | 10/1962 | Frank | 228—40 |
| 3,226,821 | 1/1966 | Van Dijk et al. | 228—36X |
| 3,499,220 | 3/1970 | Hintz et al. | 228—36X |

JOHN F. CAMPBELL, Primary Examiner

R. J. CRAIG, Assistant Examiner

U.S. Cl. X.R.

29—626; 118—400; 228—40